(12) United States Patent
Mattero et al.

(10) Patent No.: US 11,778,750 B2
(45) Date of Patent: Oct. 3, 2023

(54) STENCIL PRINTER WITH COMPONENT LOADING VERIFICATION SYSTEM AND METHOD

(71) Applicant: Illinois Tool Works Inc., Glenview, IL (US)

(72) Inventors: Patsy A. Mattero, Smithfield, RI (US); Steven R. Foster, Norfolk, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/469,996

(22) Filed: Sep. 9, 2021

(65) Prior Publication Data
US 2023/0073170 A1    Mar. 9, 2023

(51) Int. Cl.
| B41F 15/12 | (2006.01) |
| H05K 3/00 | (2006.01) |
| B41F 15/08 | (2006.01) |
| H05K 1/02 | (2006.01) |
| H05K 3/12 | (2006.01) |

(52) U.S. Cl.
CPC .......... H05K 3/0008 (2013.01); B41F 15/08 (2013.01); B41F 15/085 (2013.01); B41F 15/12 (2013.01); H05K 1/0269 (2013.01); H05K 3/1225 (2013.01); H05K 2203/0139 (2013.01)

(58) Field of Classification Search
None
See application file for complete search history.

(56) References Cited

U.S. PATENT DOCUMENTS

| 6,066,206 | A | 5/2000 | Doyle et al. |
| 2008/0289518 | A1 | 11/2008 | Inoue et al. |
| 2011/0192296 | A1* | 8/2011 | Kim ................... H05K 3/1225 |
| | | | 101/127.1 |
| 2019/0018327 | A1* | 1/2019 | Okawa ................ G03F 7/70925 |
| 2021/0221118 | A1 | 7/2021 | Falcon et al. |

FOREIGN PATENT DOCUMENTS

| JP | 2009248551 A | 10/2009 |
| WO | 2014083605 A1 | 6/2014 |
| WO | WO-2014087630 A1 * | 6/2014 ............. B41F 15/08 |

OTHER PUBLICATIONS

International Search Report and Written Opinion from International Application No. PCT/US2022/037677 dated Nov. 14, 2022.

* cited by examiner

*Primary Examiner* — Leslie J Evanisko
(74) *Attorney, Agent, or Firm* — Lando & Anastasi, LLP

(57) ABSTRACT

A stencil printer for printing an assembly material on an electronic substrate includes a frame, a stencil coupled to the frame, the stencil having apertures formed therein, a support assembly coupled to the frame, the support assembly being configured to support the electronic substrate, a print head gantry coupled to the frame, and a print head assembly supported by the print head gantry in such a manner that the print head assembly is configured to traverse the stencil during print strokes. The stencil printer further comprises a verification system to determine whether an item placed within the stencil printer is properly installed within the stencil printer.

19 Claims, 15 Drawing Sheets

STENCIL PRINTER WITH COMPONENT LOADING VERIFICATION SYSTEM AND METHOD

RELATED APPLICATION

This application relates to U.S. patent application Ser. No. 17/469,993 titled "SQUEEGEE DRIP COLLECTION SYSTEM FOR STENCIL PRINTER", by William A. Losiewicz, filed on even date herewith, which is incorporated herein by reference in their entirety for all purposes.

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for catching and containing excess material that drips from a squeegee blade during operation.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying an imaging system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on a bottom surface of the stencil is removed in a cleaning process before additional circuit boards are printed.

Components mounted or otherwise loaded within the stencil printer should be properly positioned prior to operating the stencil printer. For example, a tooling plate, which supports an electronic substrate during a stencil print operation, must be loaded correctly into the stencil printer so there is no interference between the imaging system and the tooling or other part.

SUMMARY OF THE DISCLOSURE

One aspect of the present disclosure is directed to a stencil printer for printing an assembly material on an electronic substrate. In one embodiment, the stencil printer comprises a frame, a stencil coupled to the frame, the stencil having apertures formed therein, a support assembly coupled to the frame, the support assembly being configured to support the electronic substrate, a print head gantry coupled to the frame, and a print head assembly supported by the print head gantry in such a manner that the print head assembly is configured to traverse the stencil during print strokes. The stencil printer further comprises a verification system to determine whether an item placed within the stencil printer is properly installed within the stencil printer.

Embodiments of the stencil printer further may include configuring the print head gantry with an elongate beam that rides along rails provided on the frame. The elongate beam of the print head gantry may include at least one linear bearing that extends in a horizontal direction, and wherein the verification system includes at least one tooling member configured to move laterally on the at least one linear bearing. The at least one tooling member may include a downwardly extending pin configured to be move between a fully extended position and a retracted position. The verification system further may include a controller configured to move the at least one tooling member over the item and determining whether the pin of the at least one tooling member is in the retracted position. The verification system further may include at least one sensor positioned on the at least one tooling member. The at least one sensor may be configured to produce a first visual signal indicating that the pin of the at least one tooling member is fully extended and a second visual signal indicating that the pin of the at least one tooling member is retracted. The at least one tooling member may include two spaced-apart tooling members, each including a pin. A first tooling member may be configured to move laterally on a first linear bearing and a second tooling member may be configured to move laterally on a second linear bearing. The pin of the at least one tooling member may have an end configured to be received within a receiving feature associated with the item. The item may include at least one receiving feature configured to be engaged by the pin of the at least one tooling member to engage and move the item. The at least one tooling member may include two spaced-apart tooling members, each including a pin. A first tooling member may be configured to move laterally on a first linear bearing and a second tooling member may be configured to move laterally on a second linear bearing. The at least one receiving feature may include two receiving features, one for each tooling member, the first and second tooling members being received in respective receiving features of the item to releasably secure the item. The item may include a tooling plate having a flat bottom wall configured to mate with a tooling base of the stencil printer. The verification system may include at least one tooling member configured to move laterally on at least one linear bearing of the print head gantry, the at least one tooling member includes a downwardly extending pin configured to be move between a fully extended position and a retracted position, and a controller configured to move the at least one tooling member over the item and determining whether the pin of the at least one tooling member is in the retracted position. The verification system further may include at least one sensor positioned on the at least one tooling member, the at least one sensor being configured to produce a first visual signal indicating that the pin of the at least one tooling member is fully extended and a second visual signal indicating that the pin of the at least one tooling member is retracted. The at least one tooling member may include two spaced-apart tooling members, each including a pin. A first tooling member may be configured to move laterally on a first linear bearing and a second tooling member may be configured to move laterally on a second linear bearing.

Another aspect of the present disclosure is directed to a method of verifying whether an item is properly installed in a stencil printer. In one embodiment, the method comprises: installing an item in a stencil printer; and verifying whether the item is properly installed within the stencil printer.

Embodiments of the method further may include, when verifying whether the item is properly installed within the stencil printer, moving at least one tooling member laterally on at least one linear bearing of a print head gantry over the item, and determining whether the at least one tooling member engages the item. The at least one tooling member may include a downwardly extending pin configured to be move between a fully extended position and a retracted position. Determining whether the at least one tooling member engages the item may include determining whether the pin of the at least one tooling member is in the retracted position. Determining whether the pin of the at least one tooling member is in the retracted position may include providing a first signal indicating that the pin of the at least one tooling member is fully extended and a second signal indicating that the pin of the at least one tooling member is retracted. The second signal may indicate that the item is not properly installed. The item may include a tooling plate having a flat bottom wall configured to mate with a tooling base of the stencil printer.

Yet another aspect of the present disclosure is directed to a verification system of a stencil printer including an elongate beam of a print head gantry having at least one linear bearing that extends in a horizontal direction. The verification system includes at least one tooling member configured to move laterally on the at least one linear bearing. The at least one tooling member may include a downwardly extending pin configured to be move between a fully extended position and a retracted position. The verification system further may include a controller configured to move the at least one tooling member over the item and determining whether the pin of the at least one tooling member is in the retracted position. The verification system further may include at least one sensor positioned on the at least one tooling member. The at least one sensor may be configured to produce a first visual signal indicating that the pin of the at least one tooling member is fully extended and a second visual signal indicating that the pin of the at least one tooling member is retracted.

In another aspect, the at least one tooling member may include two spaced-apart tooling members, each including a pin. A first tooling member may be configured to move laterally on a first linear bearing and a second tooling member may be configured to move laterally on a second linear bearing. The pin of the at least one tooling member may have an end configured to be received within a receiving feature associated with the item. The item may include at least one receiving feature configured to be engaged by the pin of the at least one tooling member to engage and move the item. The at least one tooling member may include two spaced-apart tooling members, each including a pin. A first tooling member may be configured to move laterally on a first linear bearing and a second tooling member may be configured to move laterally on a second linear bearing. The at least one receiving feature may include two receiving features, one for each tooling member, the first and second tooling members being received in respective receiving features of the item to releasably secure the item. The item may include a tooling plate having a flat bottom wall configured to mate with a tooling base of the stencil printer. The verification system may include at least one tooling member configured to move laterally on at least one linear bearing of the print head gantry, the at least one tooling member includes a downwardly extending pin configured to be move between a fully extended position and a retracted position, and a controller configured to move the at least one tooling member over the item and determining whether the pin of the at least one tooling member is in the retracted position. The verification system further may include at least one sensor positioned on the at least one tooling member, the at least one sensor being configured to produce a first visual signal indicating that the pin of the at least one tooling member is fully extended and a second visual signal indicating that the pin of the at least one tooling member is retracted. The at least one tooling member may include two spaced-apart tooling members, each including a pin. A first tooling member may be configured to move laterally on a first linear bearing and a second tooling member may be configured to move laterally on a second linear bearing.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
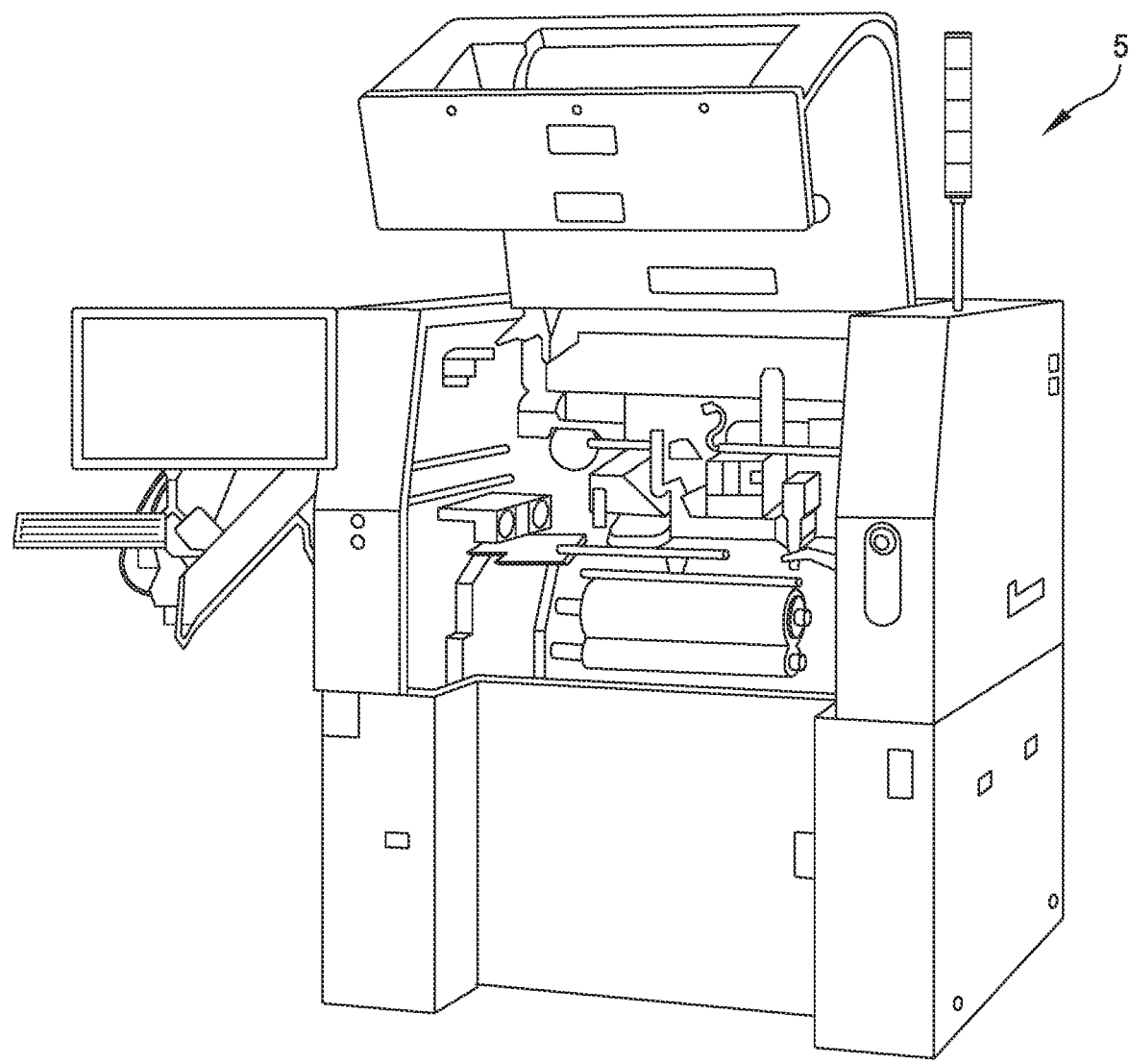
FIG. 1 is a front view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulants. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Mass. An exemplary stencil printer is generally designated at 5 in FIG. 1. In this embodiment, the stencil printer 5 is a Momentum® series stencil printer platform offered by ITW Electronic Assembly Equipment of Hopkinton, Mass.

Figure 2:
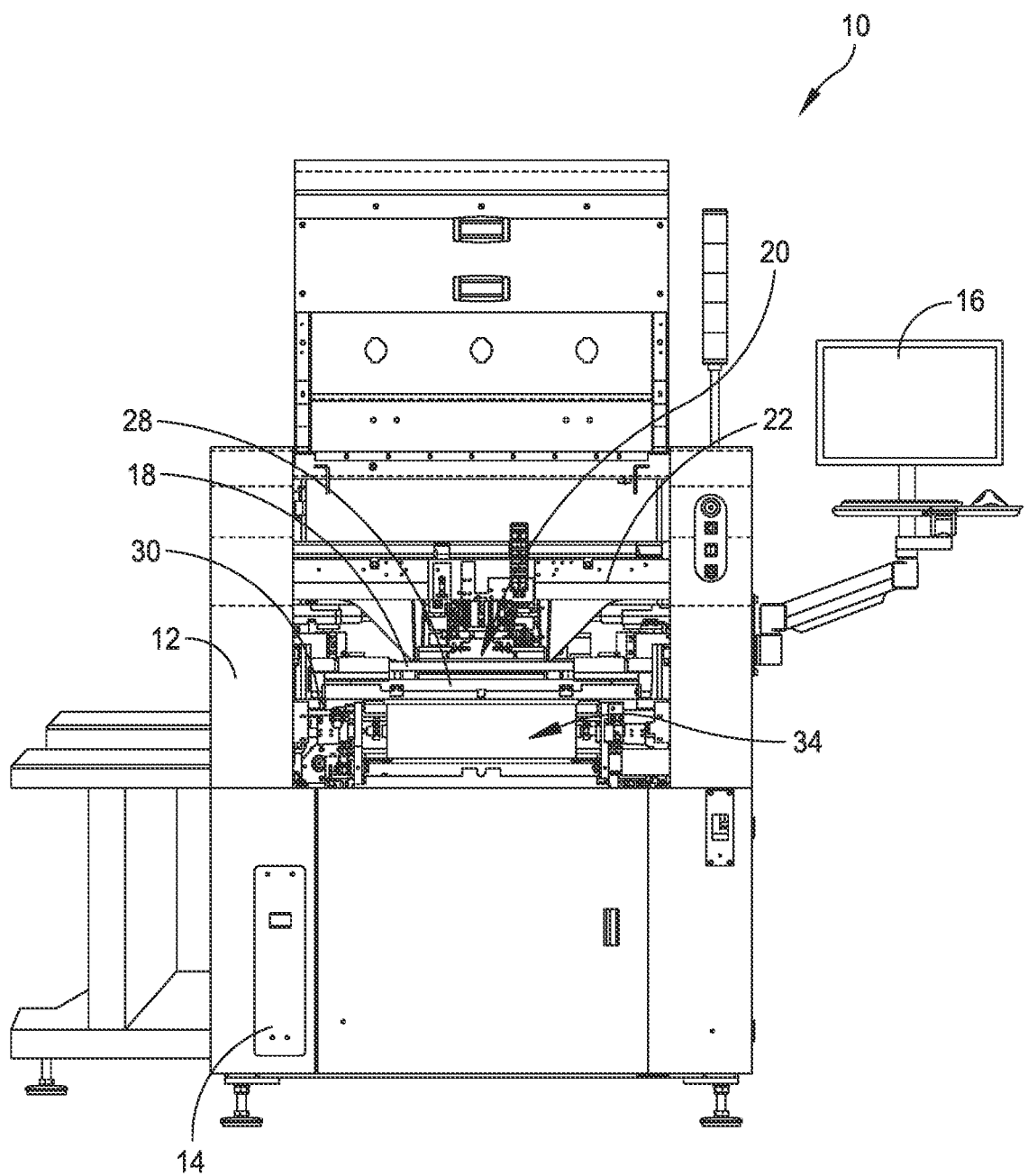
FIG. 2 is a front perspective view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry, generally indicated at 22, sometimes referred to as a "print head gantry," which may be mounted on the frame 12. The print head assembly 20 includes a print head having squeegee blades, which are configured to move across the stencil 18 during a print operation. Specifically, the print head is configured to dispense solder paste (or another viscous material) on the stencil 18 and the squeegee blades are configured to force the solder paste through apertures formed in the stencil. The print head gantry 22 enables the print head assembly 20 to be moved in the y-axis direction under the control of the controller 14 and to apply pressure on squeegee blades of the print head assembly as it engages the stencil 18. In a certain embodiment, the print head assembly 20 may be placed over the stencil 18 and may be lowered in the z-axis direction into contact and sealingly engage the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
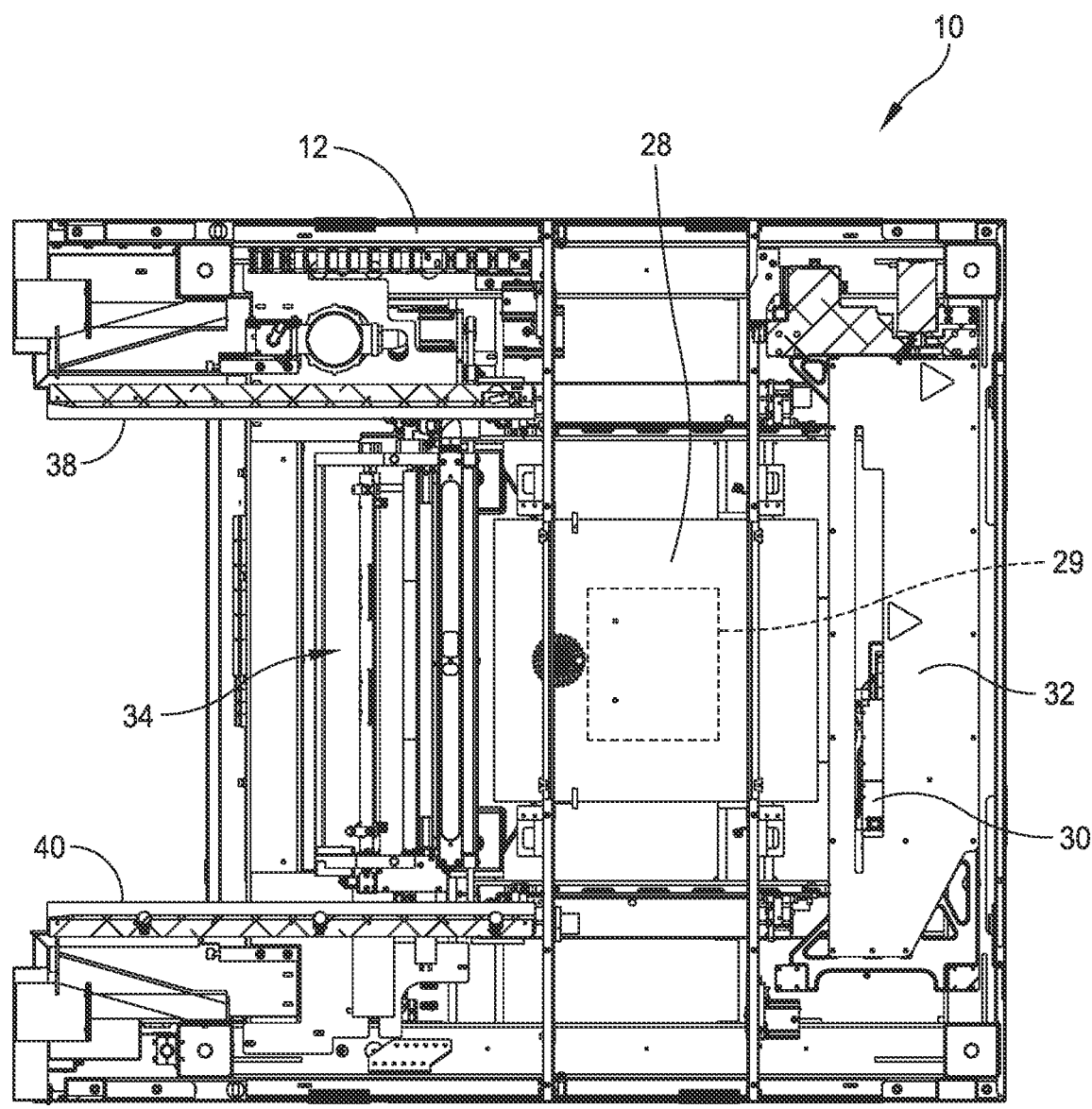
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, that provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back-and-forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

Figure 4:
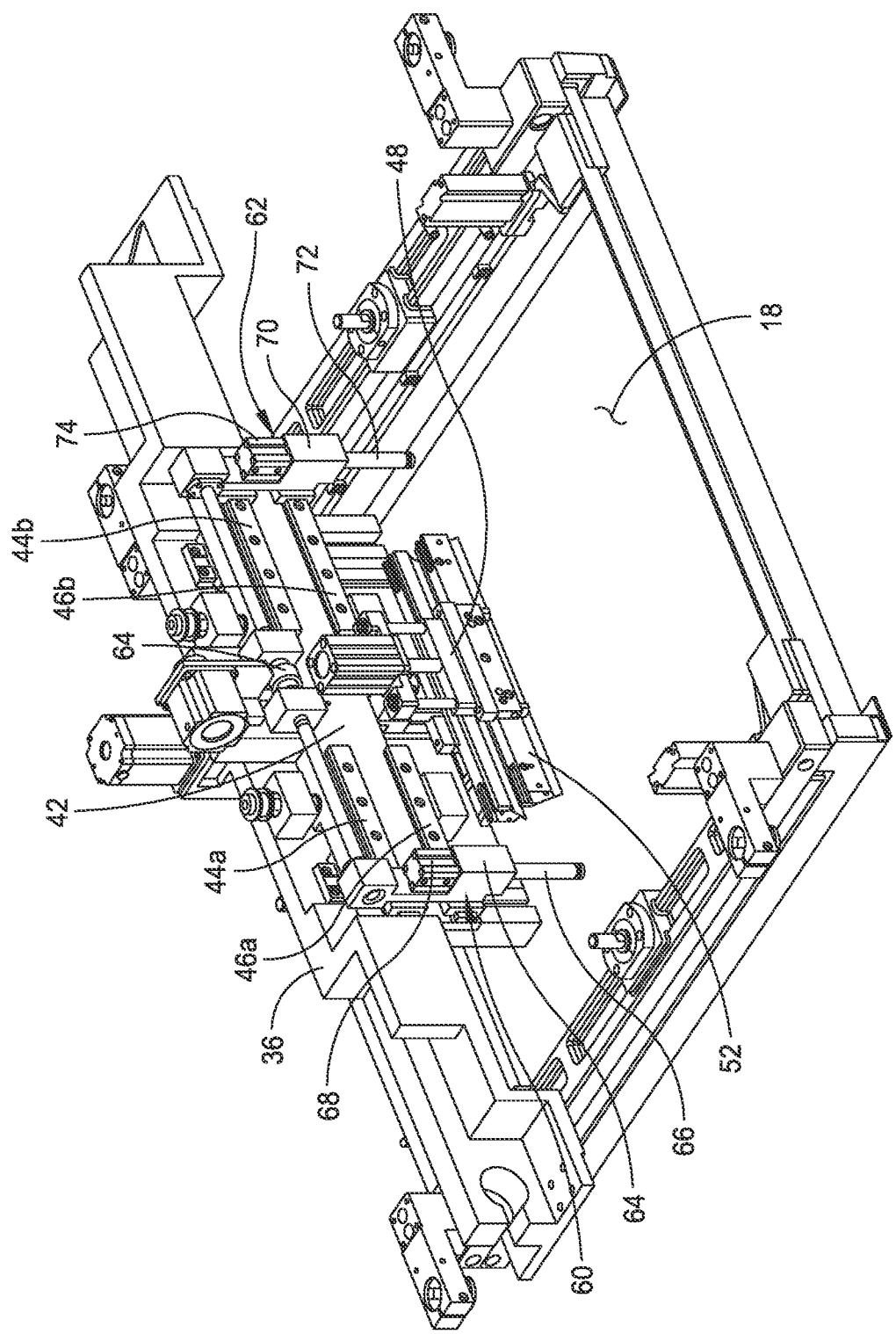
FIG. 4 is a perspective view of a print head assembly having tooling members pins of an embodiment of the present disclosure.
Figure 5:
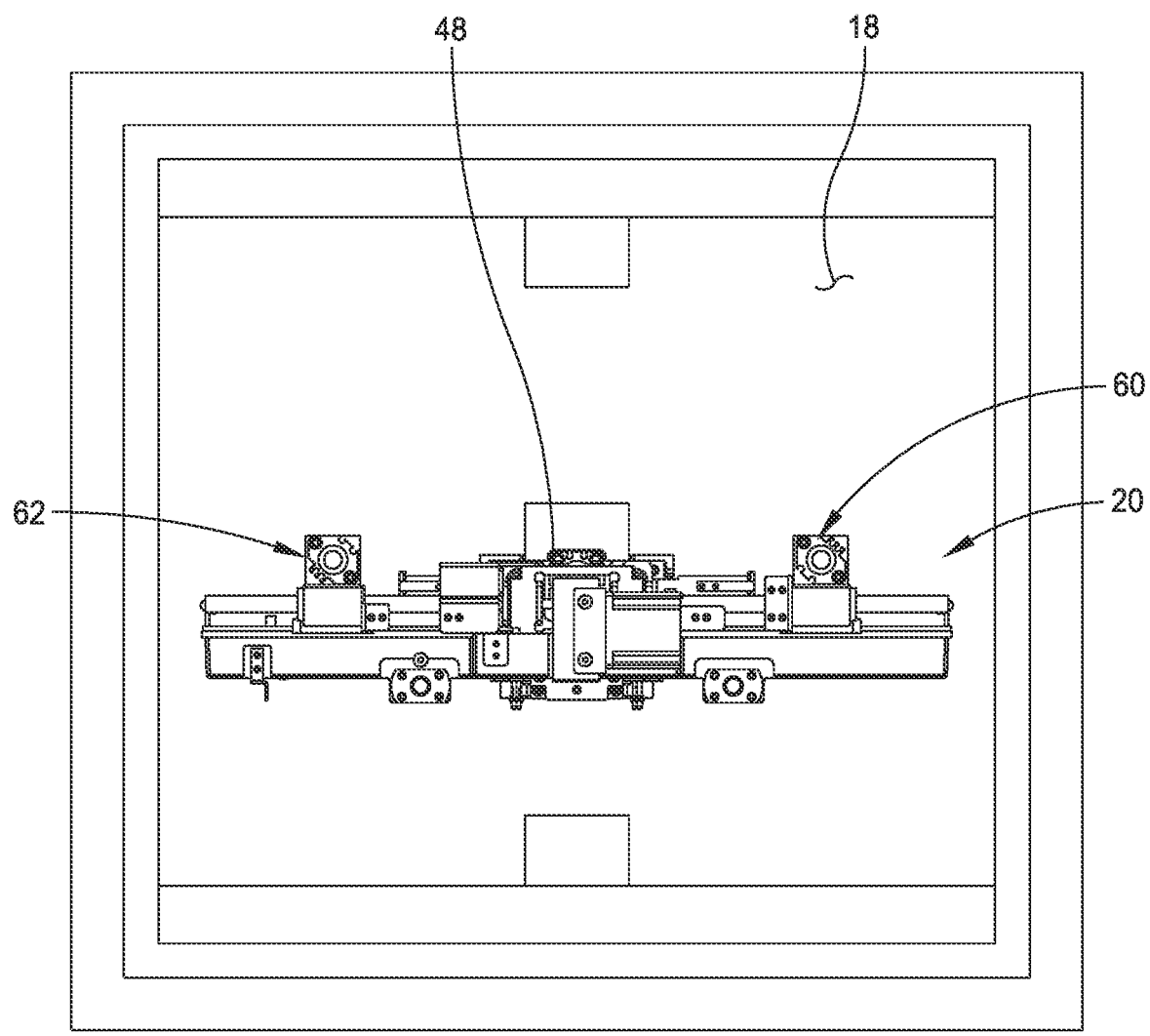
FIG. 5 is a top plan view of the print head assembly.
Figure 6:
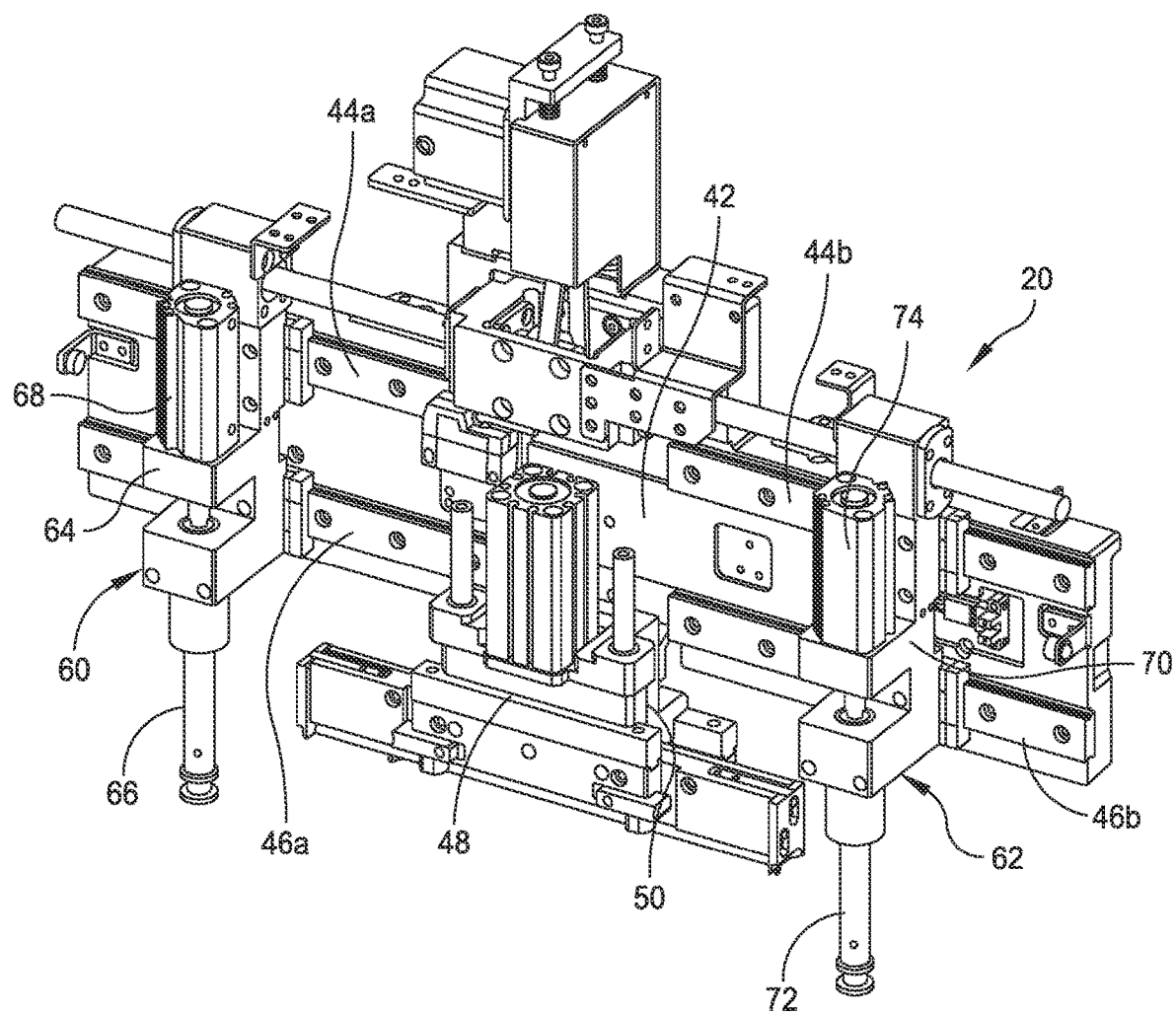
FIG. 6 is another perspective view of the print head assembly.

Referring to FIGS. 4-6, the print head assembly 20 is mounted on the print head gantry 22 to provide movement in the y-axis direction under the control of the controller 14. The print head gantry 22 includes an elongate beam 36 that rides along rails 38, 40 (FIG. 3) provided on the frame 12 of the stencil printer 10. The beam 36 includes a plate 42 having two groups of linear bearings that extend in a horizontal direction on the plate, with top linear bearings 44a, 44b being disposed above bottom linear bearings 46a, 46b. The purpose of the linear bearings 44a, 44b, 46a, 46b will be described in greater detail below. The print head assembly 20 includes a print head 48, which is coupled to the beam 36 of the print head gantry 22. Specifically, the print head 48 is mounted on a carriage 50 fixedly mounted on the plate 42. Thus, the print head gantry 22 provides movement of the print head 48 in the y-axis direction to perform the print strokes described herein. The print head 48 includes a squeegee blade assembly indicated at 52 to roll solder paste along the stencil in the manner described above. In one embodiment, the squeegee blade assembly 52 includes two squeegee blades, with viscous material, e.g., solder paste, disposed between the squeegee blades.

Embodiments of the stencil printer 10 are directed to systems and methods to measure whether a tooling plate or other parts have been loaded correctly into the stencil printer so there is no interference between subassemblies of the stencil printer, such as the imaging system 30 and the tooling or other part. Specifically, the stencil printer 10 includes tooling members that are configured to extend and retract in the z-axis direction, with the tooling members being mounted on the print head 20 or the print head gantry 22 to enable movement in the x-axis and y-axis directions. By moving the tooling members in the x-axis, y-axis and z-axis directions, the stencil printer 10 can be configured to detect the heights of components, including tooling plates, to determine whether these components are properly loaded or positioned within the stencil printer. The tooling members can be configured with limit sensors to detect whether tooling members are fully extended or retracted. The tooling members can be positioned and lowered to contact a top surface of the tooling or part until the limit sensors change state. A position counter can be employed to keep count of when the limit sensors transition from on to off and then be compared to a calibrated value, which is determined when the stencil printer 10 is first calibrated. This determination can inform the operator of the stencil printer 10 if the tooling plate is correctly placed and positioned at the correct height to prevent the tooling plate from interfering with other components of the stencil printer 10, e.g., the imaging system 30. Further, the stencil printer 10 can be configured with a "bias" regulator to maintain the tooling members in an extended position when the verification is being performed.

As mentioned above, the plate 42 that is mounted on the print head gantry 22. The plate 42 includes the two pairs of linear bearings 44a, 44b and 46a, 46b. As shown, linear bearings 44a, 46a are configured to support a first tooling member, generally indicated at 60, and linear bearings 44b, 46b are configured to support a second tooling member, generally indicated at 62, with the tooling members being configured to move laterally on their respective pairs of linear bearings.

Any suitable mechanism can be employed to move the tooling members 60, 62 laterally along the linear bearings 44a, 46a and 44b, 46b, respectively. For example, in one embodiment, a ball screw drive assembly can be employed to move the tooling members 60, 62 along the linear bearings 44a, 46a and 44b, 46b, respectively. In some embodiments, the ball screw drive assembly provided to move the tooling members 60, 62 along the linear bearings 44a, 46a and 44b, 46b, respectively, can also power an up-and-down movement of the print head 48 in the z-axis direction. As mentioned above, the print head 48 of the print head assembly 20 is configured to be lowered to engage the stencil 18 during a print operation and raised to disengage the stencil when not performing a print operation. When lowered, the print head 48 applies pressure on the squeegee blade assembly 52 as the squeegee blade assembly sealingly engages the stencil 18 in the traditional manner.

In one embodiment, the first tooling member 60 includes a first housing 64 secured to linear bearings 44a, 46a, with the first housing being configured to ride along the linear bearings in lateral directions. The first tooling member 60 further includes a first downwardly extending pin 66 disposed in a first pneumatic cylinder 68, the first pin having an end configured to be received within a receiving feature of an item desired to be moved by the tooling members, which will be described in greater detail below.

Similarly, the second tooling member 62 includes a second housing 70 secured to linear bearings 44b, 46b, with the second housing being configured to ride along the linear bearings in lateral directions. The second tooling member 62 further includes a second downwardly extending pin 72 disposed in a second pneumatic cylinder 74, the second pin having an end configured to be within a receiving feature of an item as well. The first pneumatic cylinder 68 and the second pneumatic cylinder 74 are coupled to the controller 14 and a pneumatic source to control the up-and-down movement of the pins 66, 72 of the tooling members 60, 62, respectively, independently of one another.

Referring to FIGS. 7-11, embodiments of the print head assembly 20 further includes a tooling plate, generally indicated at 80, that is configured to be loaded onto and off of a tooling base 82 of the stencil printer 10. The tooling plate 80 is provided to support electronic substrates during the printing operation. As shown, the tooling base 82 can include alignment pins, each indicated at 84, which are provided to align and ensure that the tooling plate 80 is placed correctly on the tooling base. The tooling plate 80 includes openings that are positioned and configured to receive the alignment pins 84 when placing the tooling plate on the tooling base 82.

The tooling plate 80 is a generally rectangular structure having a flat bottom wall 86 that rests on a flat surface of the tooling base 82 of the substrate support assembly 28, a short front wall, a short back wall, and two short side walls. The openings referred to above are formed on a bottom surface of the bottom wall 86 of the tooling plate 80. As shown, one side wall includes a first receiving feature 96 that extends beyond a peripheral edge of the side wall. Similarly, the other side wall includes a second receiving feature 98 that extends beyond a peripheral edge of the side wall. The receiving features 96, 98 are configured to be engaged by the pins 66, 72 of the first and second tooling members 60, 62, respectively, to engage and move the tooling plate 80.

Figure 7:
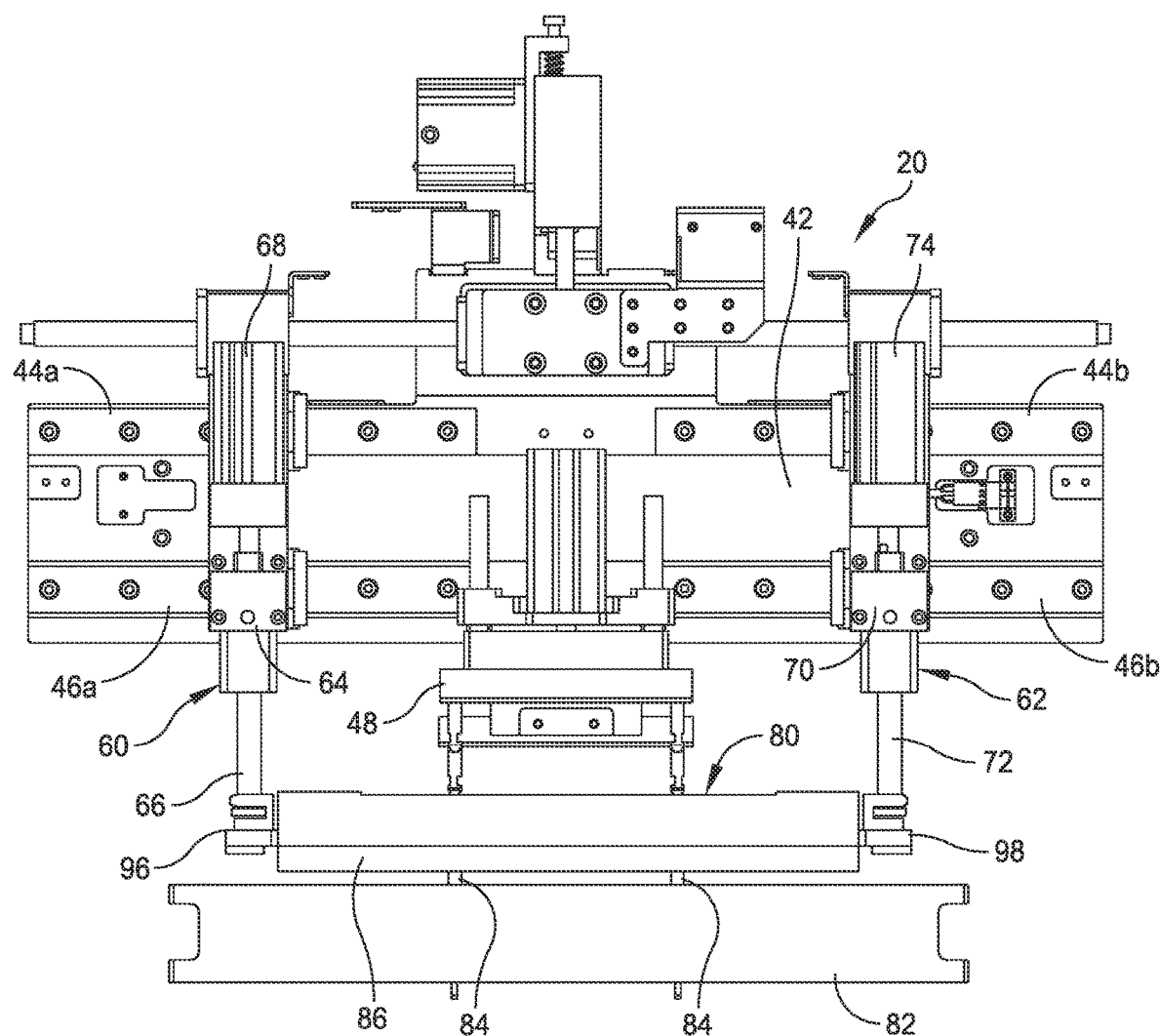
FIGS. 7-11 are front views of the print head assembly showing a sequence of positions of tooling members removing and verifying a location of tooling of the stencil printer.

Referring to FIG. 7, the ends of the pins 66, 72 of the tooling members 60, 62 are received in respective first and second receiving features 96, 98 of the tooling plate 80. The tooling members 60, 62 can be moved to a width that is approximate to a width of the first and second receiving features 96, 98 of the tooling plate 80. Once positioned on respective sides of the first and second receiving features 96, 98 of the tooling plate 80, the ends of the pins 66, 72 of the tooling members 60, 62 are moved completely within the receiving features to engage and support the tooling plate. The tooling members 60, 62 can be positioned by moving them along the linear bearings 44a, 46a and 44b, 46b, respectively, to accommodate tooling plates having various spacing of receiving features. Further, the pins 66, 72 of the tooling members 60, 62 can be lengthened or shortened to achieve a proper elevation of the ends of the pins with respect to the first and second receiving features 96, 98. The print head assembly 20 is configured to be moved in the y-axis direction by the print head gantry 22 to engage and move the tooling plate 80 to a proper position above the tooling base 82.

It should be understood that the ends of the pins 66, 72 of the tooling members 60, 62 can employ various mechanisms used to engage and move the tooling plate 80. In the shown embodiment, the pins 66, 72 of the tooling members 60, 62 have ends that are respectively received in the first and second receiving features 96, 98 of the tooling plate 80. For example, the pins 66, 72 of the tooling members 60, 62 can each include magnets to facilitate attachment and detachment of the tooling plate 80 from the tooling members to lift and move the tooling plate.

As discussed, the tooling members 60, 62 can be configured to pick up and release the tooling plate 80. Specifically, the tooling members 60, 62 are configured to toollessly engage and disengage the first and second receiving features 96, 98 of the tooling plate 80.

Figure 8:
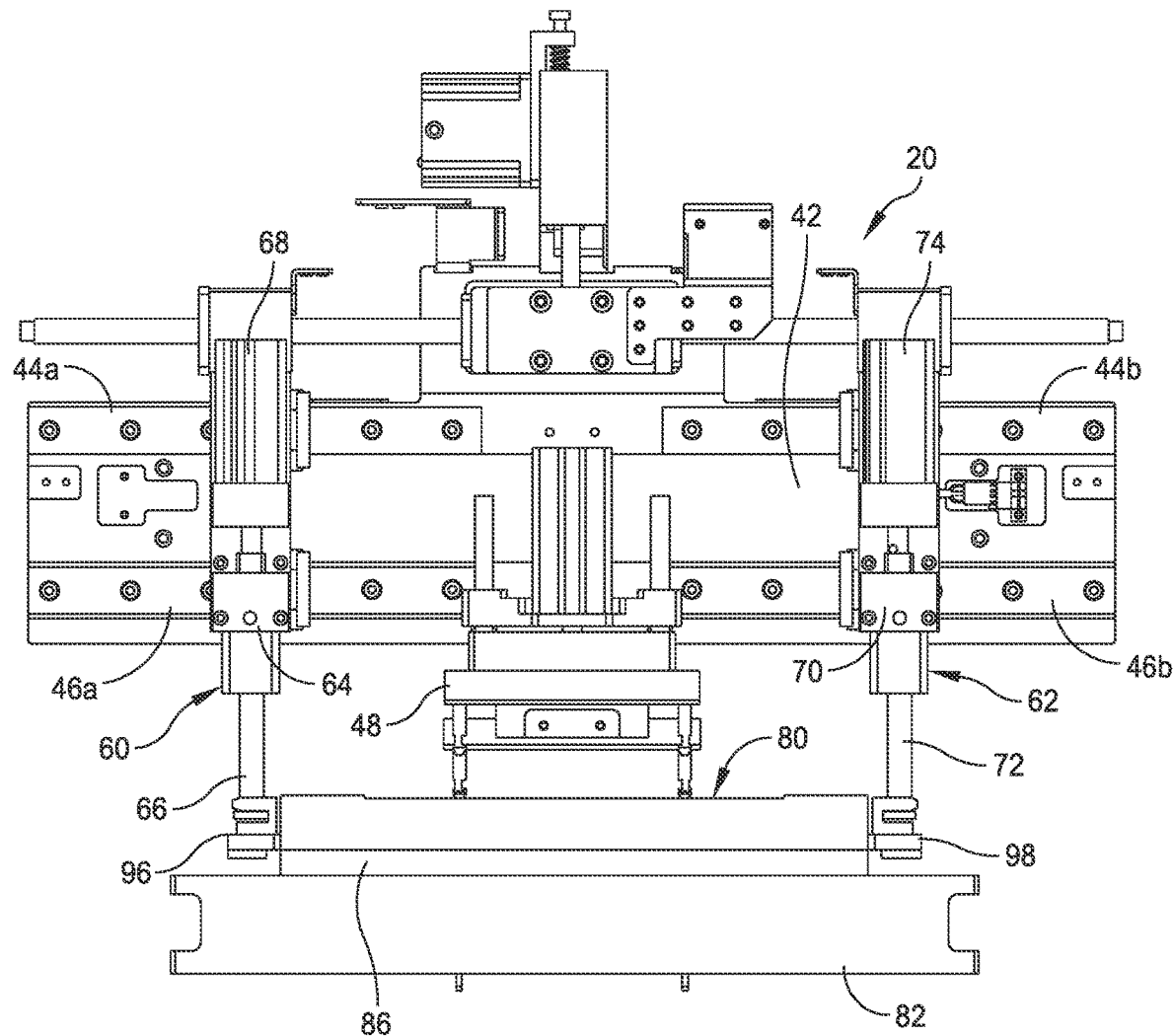

Referring to FIG. 8, the tooling plate 80 is lowered to engage and be seated on the tooling base 82, with the alignment pins 84 (FIG. 7) of the tooling base being received within the openings of the tooling plate. As shown, the tooling plate 80 rests flat on the top surface of the tooling base 82. The bottom surface of the bottom wall 86 of the tooling plate 80 can be configured to mate with the top surface of the tooling base 82 to provide an accurate positioning of the tooling plate on the tooling base.

Figure 9:
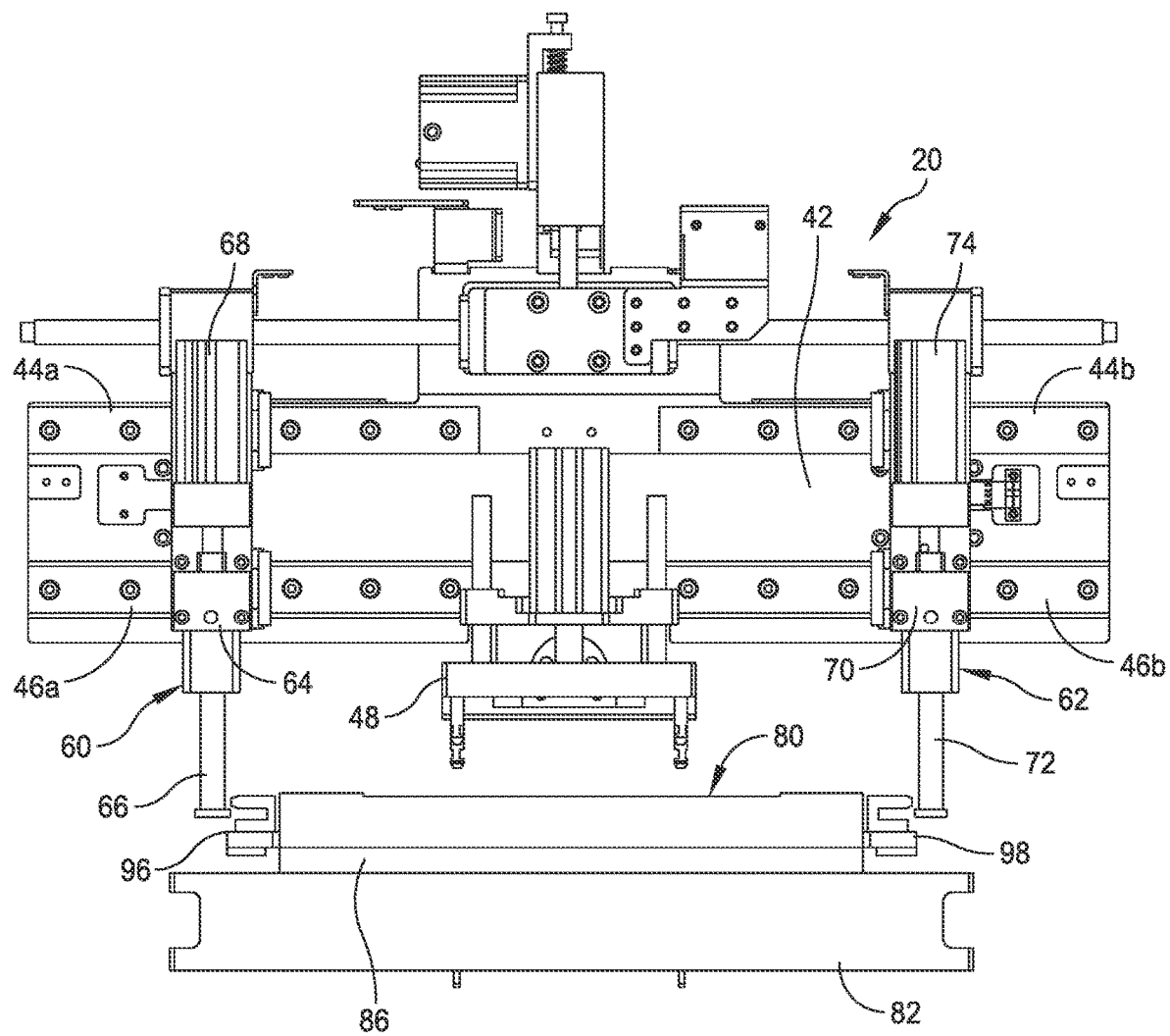

Referring to FIG. 9, to remove the tooling members 60, 62 from the receiving features 96, 98 of the tooling plate 80, the tooling members are moved outboard with respect to the tooling plate. Specifically, the first tooling member 60 shown in FIG. 9 is moved along the linear bearings 44a, 46a to the left, away from the receiving feature 96 of the tooling plate 80 so that the pin 66 is cleared away from the receiving feature. Similarly, the second tooling member 62 shown in FIG. 9 is moved along the linear bearings 44b, 46b to the right, away from the receiving feature 98 of the tooling plate 80 so that the pin 72 is cleared away from the receiving feature.

Figure 10:
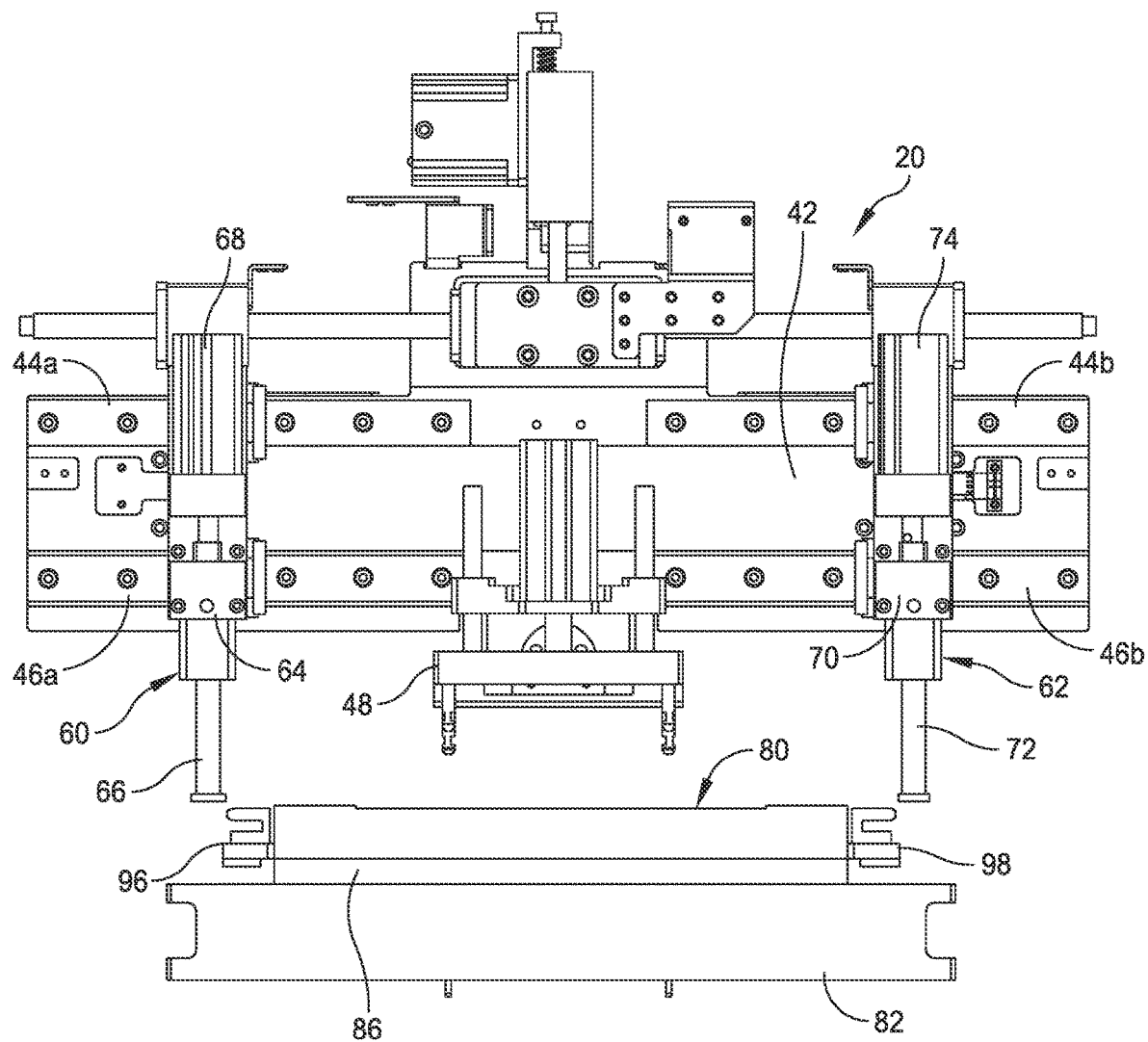

Referring to FIG. 10, the print head 20 is raised to as to move ends of the pins 66, 72 of the tooling members 60, 62 upwardly so that the ends are positioned along a plane that is just above a plane of a top surface of the tooling plate 80. As shown, the pins 66, 72 of the tooling members 60, 62 are fully extended.

Figure 11:
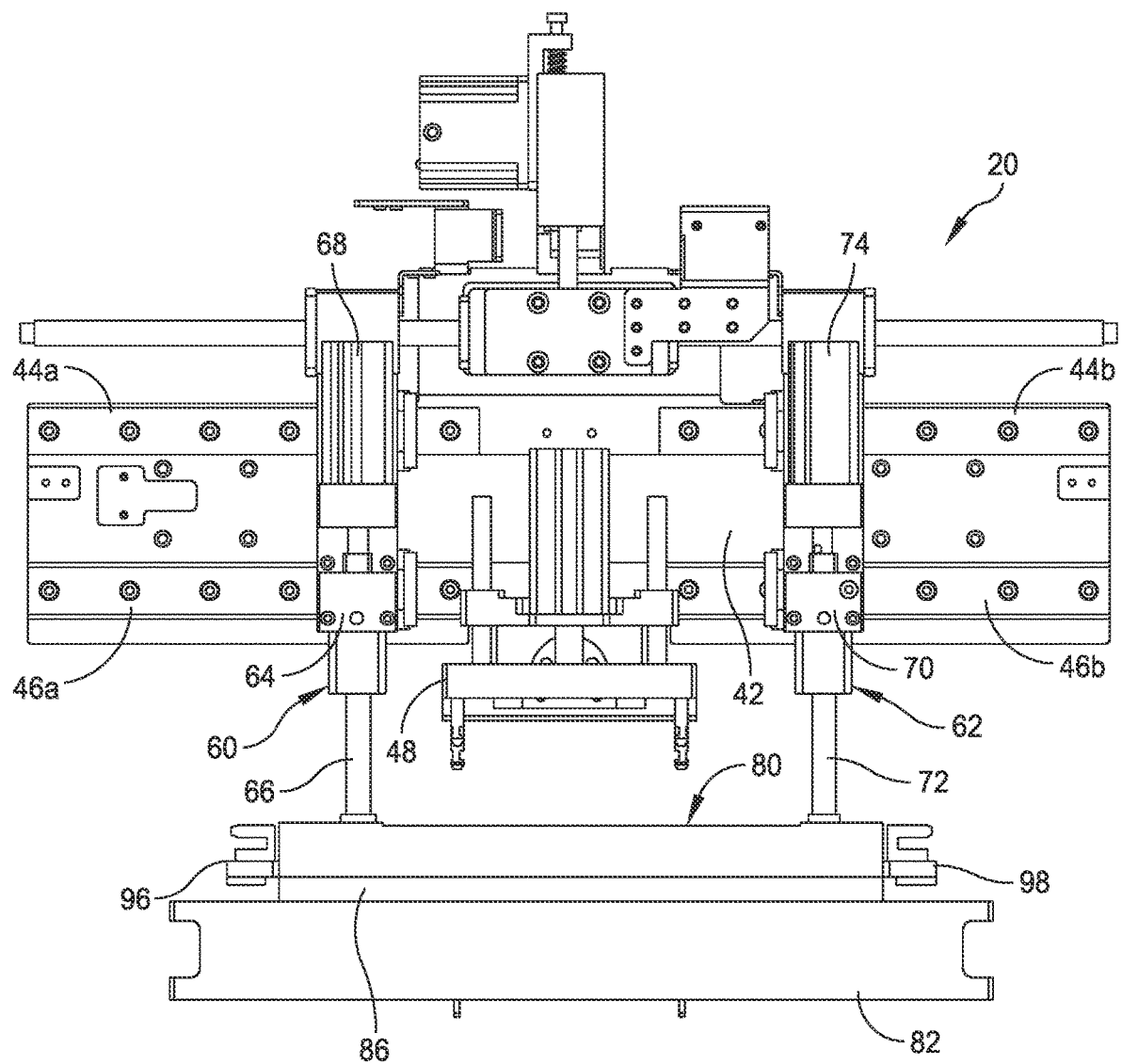

Referring to FIG. 11, the tooling members 60, 62 are moved inboard so that the ends of the pins 66, 72 of the tooling members are disposed just above a top surface of the tooling plate 80. Specifically, the first tooling member 60 shown in FIG. 11 is moved along the linear bearings 44a, 46a to the right, toward the second tooling member 62. Similarly, the second tooling member 62 shown in FIG. 11 is moved along the linear bearings 44b, 46b to the left, toward the first tooling member 60. As shown, the ends of the pins 66, 72 of the tooling members 60, 62 are disposed just above the top surface of the tooling plate 80.

Figure 12:
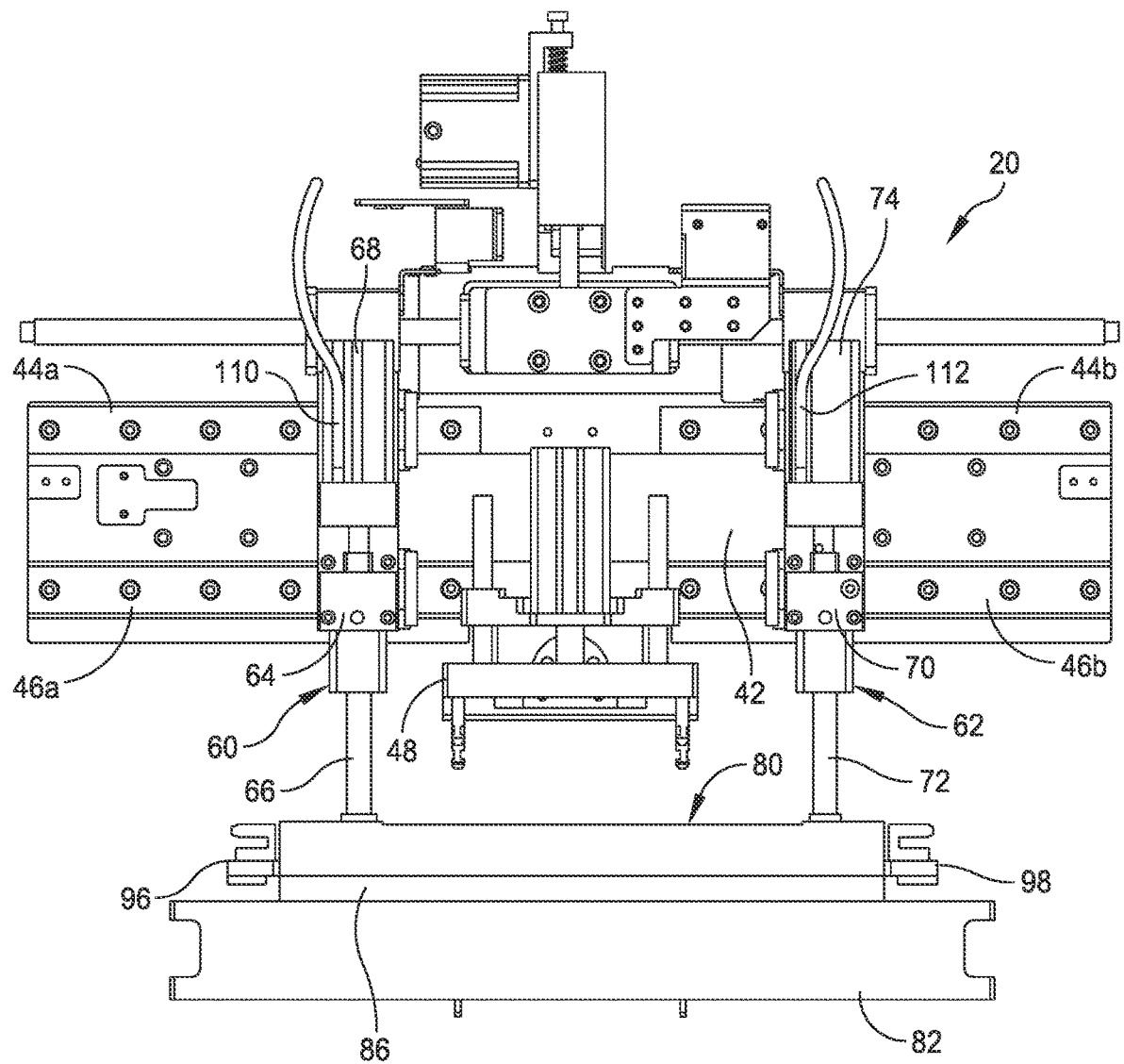
FIG. 12 is a front view verifying that the tooling is in a proper position.

Referring to FIG. 12, a verification system to determine whether the tooling plate 80 is properly positioned on the tooling base. As shown, the verification system includes a first sensor 110 positioned on the first tooling member 60 adjacent the first pneumatic cylinder 68. The first sensor 110 is configured to detect a position of the first tooling member 60 and to produce a visual signal, e.g., a red light, when the first pin 66 of the first tooling member is fully extended and another visual signal, e.g., a white light or no light, when the first pin of the first tooling member is less than fully extended. The verification system further includes a second sensor 112 positioned on the second tooling member 62 adjacent the second pneumatic cylinder 74. The second sensor 112 is configured to detect a position of the second tooling member 62 and to produce a visual signal, e.g., a red light, when the second pin 72 of the second tooling member is fully extended and another visual signal, e.g., a white light or no light, when the second pin of the second tooling member is less than fully extended. In one embodiment, the first and second sensors 110, 112 of the verification system are coupled to the controller 14 to notify the operator of the status of the sensors beyond the visual signals provided by the sensors.

In some embodiments the verification system can produce audible signals that one of the pins 66, 72 are less than fully extended. Further, a notification can be produced on the display 16 of the stencil printer 10.

FIG. 12 illustrates the verification system indicating that the tooling plate 80 is properly seated on the tooling base. As shown, the pins 66, 72 of the tooling members 60, 62 are in fully extended positions. Thus, the visual signals or indicators of the sensors 110, 112 indicate the fully extended positions of the pins 66, 72. As a result, an operator of the stencil printer 10 would know, through visual inspection of the first and second sensors 110, 112, or through the display 16 coupled to the controller 14, that the tooling plate 80 is properly seated on the tooling base.

Figure 13:
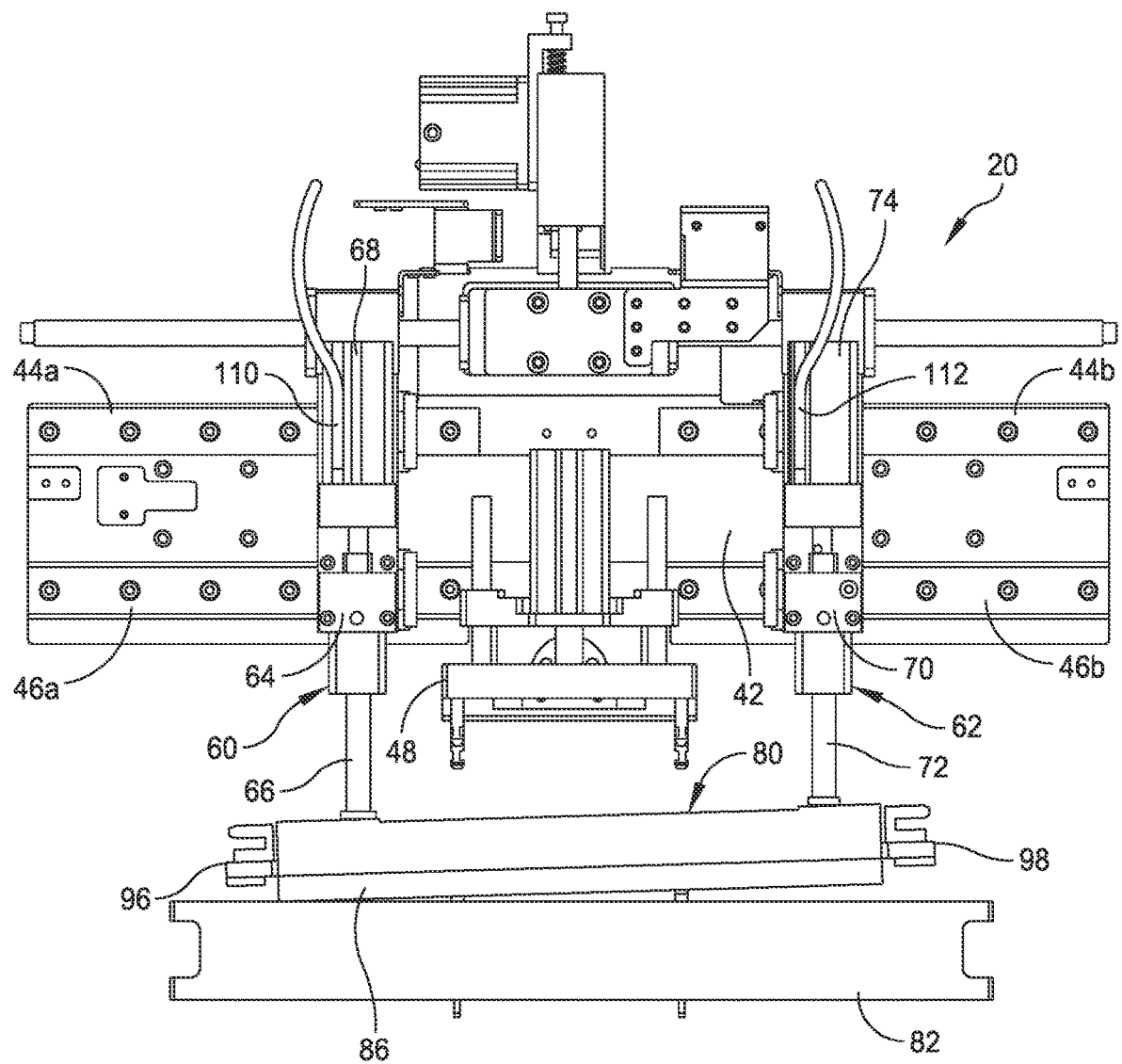
FIG. 13 is a front view verifying that the tooling is in an improper position.

Referring to FIG. 13, the verification system is shown to indicate that the tooling plate 80 is not properly seated on the tooling base 82. As shown, the first pin 66 of the first tooling member 60 is shown to be in the fully extended position. However, the second pin 72 of the second tooling member 62 is not fully extended. Thus, the visual signal or indicator of the first sensor 110 indicates the fully extended position of the first pin 66 of the first tooling member 60 and the visual signal of the second sensor 112 indicates the shortened position of the second pin 72 of the second tooling member 62. As a result, an operator of the stencil printer 10 would know, through visual inspection of the first and second sensors 110, 112, or through the display 16 coupled to the controller 14, that the tooling plate 80 is not properly seated on the tooling base 82. The display 16 can instruct the operator to correct the seating of the tooling plate 80 prior to a catastrophic event, such as the imaging system 30 interfering with the tooling plate.

Figure 14:
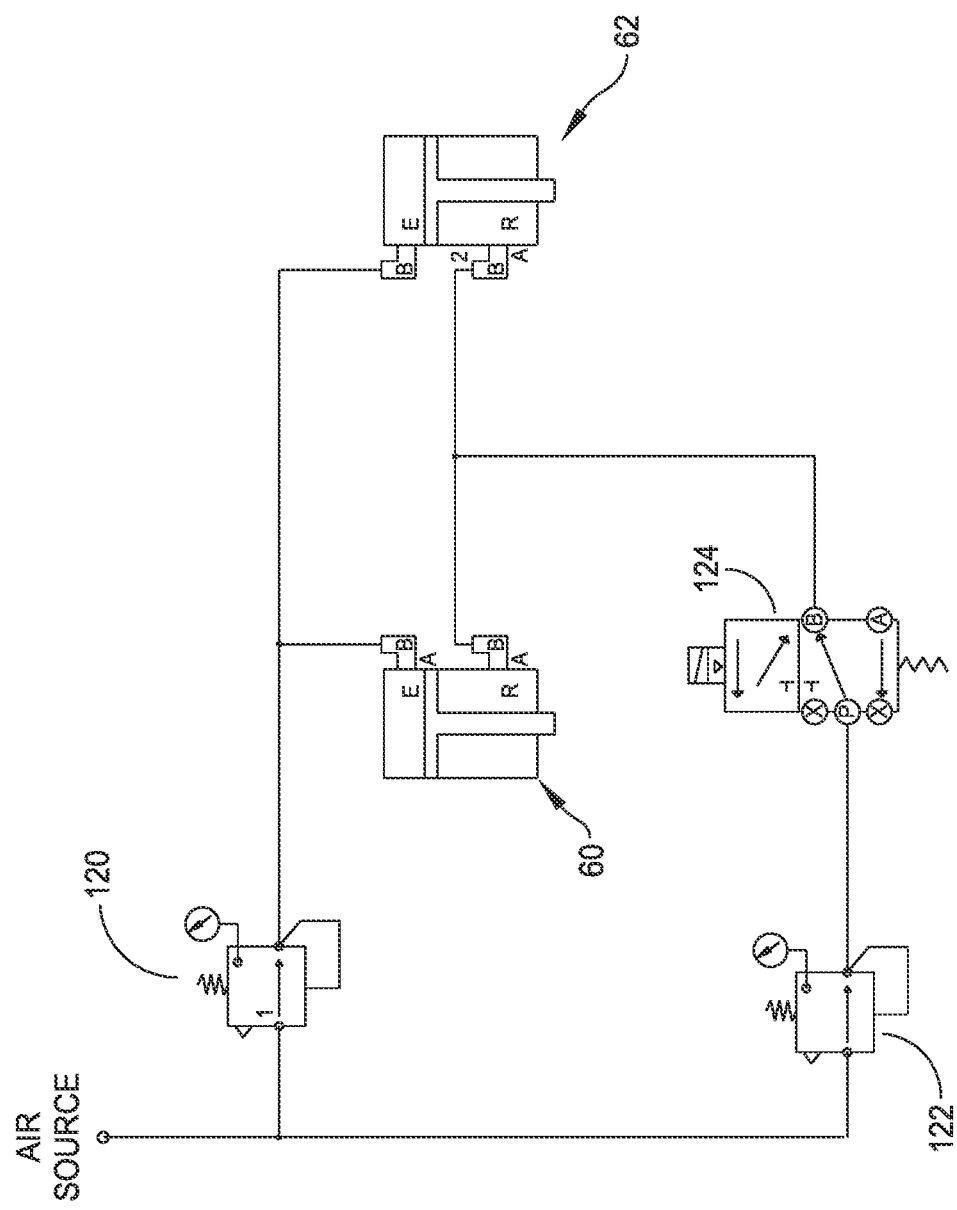
FIG. 14 is a schematic view of a pneumatic configuration for the tooling members.

Referring to FIG. 14, pneumatic control of the first tooling member 60 and the second tooling member 62 is schematically illustrated. As shown, a first regulator 120 is provided to control air flow to the first tooling member 60 and the second tooling member 62 to provide downward movement and extension of the first pin 66 and the second pin 72, respectively. A second regulator 122 is provided to control air flow to the first tooling member 60 and the second tooling member 62 to provide upward movement and retraction of the first pin 66 and the second pin 72, respectively. A solenoid valve 124 is provided between the second regulator 122 and the first and second tooling members 60, 62 to control flow of air to the tooling members to provide retraction of the pins 66, 72. The pneumatic control of the first tooling member 60 and the second tooling member 62 is provided by the controller 14, which is coupled to the first regulator 120, the second regulator 122 and the solenoid valve 124.

Figure 15:
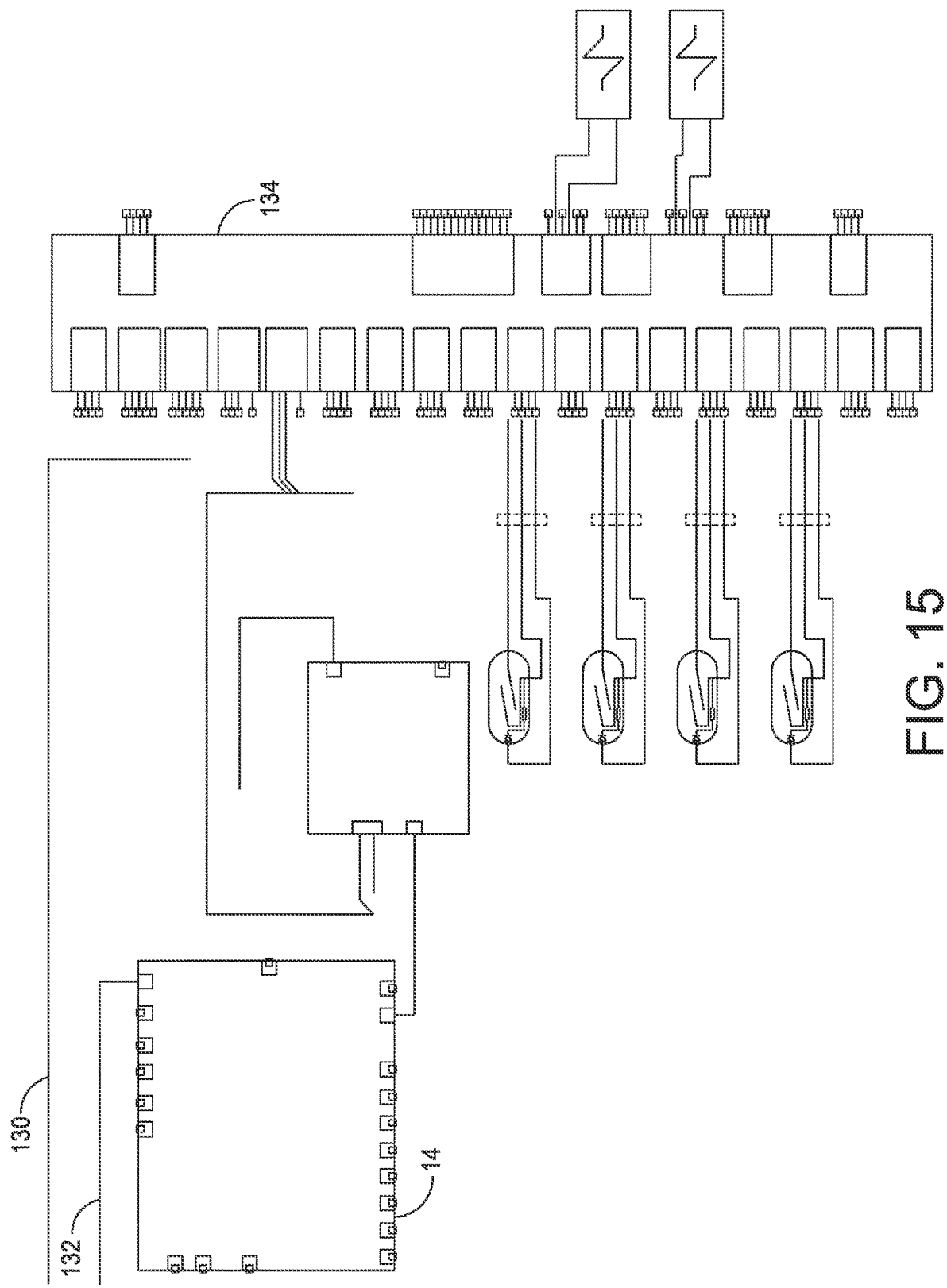
FIG. 15 is a schematic view of an electrical configuration for the tooling members.

Referring to FIG. 15, electronic control of the first tooling member 60 and the second tooling member 62 is schematically illustrated. As shown, the controller 14 is coupled to a DC power supply 130 and an AC power supply 132, which are coupled to the first tooling member 60 and the second tooling member 62. A can bus module 134 is provided to control the extension and the retraction of the pins 66, 72 of the tooling members 60, 62, respectively.

Embodiments of the present disclosure include a method of verifying whether an item, such as a tooling plate 80, is properly seated or positioned within the stencil printer 10. In one embodiment, the method includes moving an item, such as the tooling plate 80, from a remote position to an installed position within the stencil printer 10. Once in position, the method further includes verifying whether the item is properly installed within the stencil printer 10.

In one embodiment, a method of verifying whether the item is properly positioned includes fully extending pins 66, 72 of tooling members 60, 62, moving the pins over the item, and detecting whether a pin is retracted within its respective tooling member.

The system and related methods disclosed herein may be performed under the control of controller 14. Specifically, the controller 14 can be configured to know when to move the item, e.g., the tooling plate 80, and when to replace the item. Although tooling plates are described herein as being the object of the verification system, the verification system can be used to determine whether other items are properly installed in the stencil printer 10.

In some embodiments, existing stencil printer gantries, rails and print head of the stencil printer 10 can be configured to shuttle items in and out, including the tooling plate 80.

In some embodiments, the print head assembly 20 of the stencil printer 10 can be configured to move and install a tooling plate 80.

In some embodiments, each sensor, i.e., sensors 110, 112, can embody an analog position sensor, which is configured to sense the magnetic flux line from a magnet in a pneumatic cylinder bore of the tooling members 60, 62. The analog position sensor can interpret its linear position and convert this to an analog voltage, current or field bus signal type of output, which can be sent to the controller 14 of the stencil printer 10 to be converted to a distance measurement.

In some embodiments, each sensor, i.e., sensors 110, 112, can embody a laser height sensor, which is configured to emit a beam of light directed to reflect off a target, e.g., the tooling plate, and received to interpret a height based on a deviation of the returned light to the sensor. The laser height sensor can convert this to an analog voltage, current or field bus signal type of output, which can be sent to the controller 14 of the stencil printer 10 to be converted to a distance measurement.

In some embodiments, each sensor, i.e., sensors 110, 112, can embody an ultrasonic sensor, which is configured to emit a sound wave detected to bounce off a target, e.g., the tooling plate, and received to interpret a height based on the returned sound of the sensor. The ultrasonic sensor can convert this to an analog voltage, current or field bus signal type of output, which can be sent to the controller 14 of the stencil printer 10 to be converted to a distance measurement.

In some embodiments, each sensor, i.e., sensors 110, 112, can embody a linear analog position sensor, which is an integral slider/contact assembly. The linear analog position sensor detects changes in position directly and translates these changes to specific resistances combined with a voltage or current sense circuit. The output from the linear analog position sensor can be converted to an analog voltage, current or field bus signal type of output, which can be sent to the controller 14 of the stencil printer 10 to be converted to a distance measurement.

In some embodiments, each sensor, i.e., sensors 110, 112, can embody a contact probe, which can be point of contact assembly. The contact probe can be mounted to the moveable z-axis assembly and when the assembly presses against a surface, e.g., the tooling plate, the contact probe makes or breaks contact. Combined with a voltage, current or field bus type of output, a change of state of the contact probe can be converted to a high or low signal and then be sent to the controller 14 of the stencil printer 10 to be converted to a distance measurement when coupled with a z-axis position counter.

In some embodiments, each sensor, i.e., sensors 110, 112, can embody a camera positioned to obtain an image across a top plane of the tooling once positioned. The image can either be compared to a trained image or in real-time. A region of interest can be compared to the acquired image and the trained image to determine whether any pixels of the image have changed their state and converted to a distance based on the calibrated mils per pixel. Any type of camera can be used to perform this function.

As used herein, "properly positioned," "properly seated" and/or "properly installed" means that an item is in a proper location or position within the stencil printer as determined by the controller after examining data associated with one or more images taken by the imaging system or camera, with such known locations being within a predetermined tolerance, or by a known fit between the item and the portion of the stencil printer designed to receive the item.

As used herein, "transport" or "transporting" describes moving an item from one position to another, either manually or automatically.

As used herein, "install" or "installing" describes the process of placing an item in a position ready for use.

The concepts disclosed herein may be employed in other types of equipment used to fabricate electronic substrates, including dispensers, pick-and-place machines, reflow ovens, wave soldering machines, selective solder machines, inspection stations, and cleaning stations. For example, the concepts directed to recapturing materials can be employed in soldering and wave soldering machines and in cleaning stations.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing an assembly material on an electronic substrate, the stencil printer comprising:
    a frame;
    a stencil coupled to the frame;
    a support assembly coupled to the frame, the support assembly being configured to support the electronic substrate;
    a print head gantry coupled to the frame;
    a print head assembly supported by the print head gantry in such a manner that the print head assembly is configured to traverse the stencil during print strokes; and
    a verification system to determine whether an item placed within the stencil printer is properly installed within the stencil printer,
    wherein the print head gantry includes an elongate beam that rides along rails provided on the frame, the elongate beam of the print head gantry including at least one linear bearing that extends in a horizontal direction, and wherein the verification system includes at least one tooling member configured to move laterally on the at least one linear bearing.

2. The stencil printer of claim 1, wherein the at least one tooling member includes a downwardly extending pin configured to be moved between a fully extended position and a retracted position.

3. The stencil printer of claim 2, wherein the verification system further includes a controller configured to move the at least one tooling member over the item and determining whether the pin of the at least one tooling member is in the retracted position.

4. The stencil printer of claim 3, wherein the verification system further includes at least one sensor positioned on the at least one tooling member, the at least one sensor being configured to produce a first visual signal indicating that the pin of the at least one tooling member is fully extended and a second visual signal indicating that the pin of the at least one tooling member is retracted.

5. The stencil printer of claim 4, wherein the at least one tooling member includes two spaced-apart tooling members, each including a pin, a first tooling member being configured to move laterally on a first linear bearing and a second tooling member being configured to move laterally on a second linear bearing.

6. The stencil printer of claim 2, wherein the pin of the at least one tooling member has an end configured to be received within a receiving feature associated with the item.

7. The stencil printer of claim 6, wherein the item includes at least one receiving feature configured to be engaged by the pin of the at least one tooling member to engage and move the item.

8. The stencil printer of claim 7, wherein the at least one tooling member includes two spaced-apart tooling members, each including a pin, a first tooling member being configured to move laterally on a first linear bearing and a second tooling member being configured to move laterally on a second linear bearing, and wherein the at least one receiving feature includes two receiving features, one for each tooling member, the first and second tooling members being received in respective receiving features of the item to releasably secure the item.

9. The stencil printer of claim 8, wherein the item includes a tooling plate having a flat bottom wall configured to mate with a tooling base of the stencil printer.

10. A method of verifying whether an item is properly installed in the stencil printer of claim 1, the method comprising:
    installing an item in the stencil printer; and
    verifying whether the item is properly installed within the stencil printer.

11. The method of claim 10, wherein verifying whether the item is properly installed within the stencil printer includes
    moving the at least one tooling member laterally on the at least one linear bearing of a print head gantry over the item, and
    determining whether the at least one tooling member engages the item.

12. The method of claim 11, wherein the at least one tooling member includes a downwardly extending pin configured to be move between a fully extended position and a retracted position.

13. The method of claim 12, wherein determining whether the at least one tooling member engages the item includes determining whether the pin of the at least one tooling member is in the retracted position.

14. The method of claim 13, wherein determining whether the pin of the at least one tooling member is in the retracted position includes providing a first signal indicating that the pin of the at least one tooling member is fully extended and a second signal indicating that the pin of the at least one tooling member is retracted.

15. The method of claim 14, wherein the second signal indicates that the item is not properly installed.

16. The method of claim 10, wherein the item includes a tooling plate having a flat bottom wall configured to mate with a tooling base of the stencil printer.

17. A stencil printer for printing an assembly material on an electronic substrate, the stencil printer comprising:
    a frame;
    a stencil coupled to the frame;
    a support assembly coupled to the frame, the support assembly being configured to support the electronic substrate;
    a print head gantry coupled to the frame;

a print head assembly supported by the print head gantry in such a manner that the print head assembly is configured to traverse the stencil during print strokes; and a verification system to determine whether an item placed within the stencil printer is properly installed within the stencil printer, wherein the verification system includes at least one tooling member configured to move laterally on at least one linear bearing of the print head gantry, the at least one tooling member includes a downwardly extending pin configured to be moved between a fully extended position and a retracted position, and a controller configured to move the at least one tooling member over the item and determining whether the pin of the at least one tooling member is in the retracted position.

18. The stencil printer of claim 17, wherein the verification system further includes at least one sensor positioned on the at least one tooling member, the at least one sensor being configured to produce a first visual signal indicating that the pin of the at least one tooling member is fully extended and a second visual signal indicating that the pin of the at least one tooling member is retracted.

19. The stencil printer of claim 18, wherein the at least one tooling member includes two spaced-apart tooling members, each including a pin, a first tooling member being configured to move laterally on a first linear bearing and a second tooling member being configured to move laterally on a second linear bearing.

* * * * *